(12) United States Patent
Uehara

(10) Patent No.: US 9,396,969 B2
(45) Date of Patent: Jul. 19, 2016

(54) GLASSWORK COMPONENT, MANUFACTURING METHOD THEREOF, AND MANUFACTURING METHOD OF ELECTRONIC DEVICE

(71) Applicant: AISIN SEIKI KABUSHIKI KAISHA, Kariya-shi, Aichi-ken (JP)

(72) Inventor: Yuzuru Uehara, Chiryu (JP)

(73) Assignee: AISIN SEIKI KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 14/626,408

(22) Filed: Feb. 19, 2015

(65) Prior Publication Data
US 2015/0235869 A1 Aug. 20, 2015

(30) Foreign Application Priority Data

Feb. 20, 2014 (JP) ................................. 2014-030577

(51) Int. Cl.
*H01L 21/48* (2006.01)
*C03C 15/00* (2006.01)
*C03C 21/00* (2006.01)
*H01L 23/15* (2006.01)
(Continued)

(52) U.S. Cl.
CPC .......... *H01L 21/481* (2013.01); *C03B 33/0222* (2013.01); *C03B 33/033* (2013.01); *C03C 15/00* (2013.01); *C03C 21/002* (2013.01); *H01L 21/486* (2013.01); *H01L 23/15* (2013.01); *C03B 33/037* (2013.01); *C03B 33/07* (2013.01); *C03B 33/074* (2013.01); *H01L 23/49816* (2013.01); *H01L 23/49827* (2013.01); *H01L 2224/16225* (2013.01); *H01L 2924/15311* (2013.01); *Y10T 428/24777* (2015.01)

(58) Field of Classification Search
None
See application file for complete search history.

(56) References Cited

U.S. PATENT DOCUMENTS

| | | | | |
|---|---|---|---|---|
| 2009/0002958 A1* | 1/2009 | Li | ......................... | H05K 3/0032 361/748 |
| 2013/0037308 A1* | 2/2013 | Wang | ...................... | C03C 17/34 174/250 |
| 2013/0291598 A1* | 11/2013 | Saito | .................. | B23K 26/0057 65/112 |

FOREIGN PATENT DOCUMENTS

| | | |
|---|---|---|
| JP | 2012-166999 A | 9/2012 |
| JP | 2013-102138 A | 5/2013 |
| JP | 2013-537723 A | 10/2013 |

(Continued)

OTHER PUBLICATIONS

"3D Silicon & Glass Interposers", Yole Development, Internet (URL: http://www.i-micronews.com/upload/Rapports/3D_Silicon_&_Glass_Interposers_sample_2012.pdf), 2012, pp. 1-23.

(Continued)

*Primary Examiner* — Charles Garber
*Assistant Examiner* — Stanetta Isaac
(74) *Attorney, Agent, or Firm* — Sughrue Mion, PLLC

(57) ABSTRACT

A manufacturing method of a glasswork component, includes: forming a compressive stress layer which ranges from one main surface to the other main surface of a glass substrate, along a scheduled cutting line, so as to be adjacent to the scheduled cutting line of the glass substrate; and cutting the glass substrate in the scheduled cutting line.

6 Claims, 15 Drawing Sheets

(51) Int. Cl.
  C03B 33/02    (2006.01)
  *C03B 33/033*    (2006.01)
  C03B 33/037    (2006.01)
  C03B 33/07    (2006.01)
  H01L 23/498    (2006.01)

(56) References Cited

FOREIGN PATENT DOCUMENTS

WO    2011/132600 A1    10/2011
WO    2012/027220 A2    3/2012

OTHER PUBLICATIONS

"Cost, Heat Dissipation, and Test: Solution to Three Big Issues of TSV", Nikkei Electronics, Apr. 16, 2012, pp. 42-49.
"Regarding TSV Trends and Manufacturing Technology Innovation", Nikkei Electronics, Sep. 16, 2013, pp. 36-51.
John H. Lau, "Evolution, Challenge, and Outlook of TSV (Through-Silicon Via) and 3D IC/Si Integration", Keynote at IEEE Japan ICEP, Apr. 13-15, 2011, 16 pages.
Ali Said, et al., "Fabrication of high-aspect ratio, micro-fluidic channels and tunnels using femtosecond laser pulses and chemical etching", Optics Express, May 17, 2004, pp. 2120-2129, vol. 12, No. 10.

\* cited by examiner

 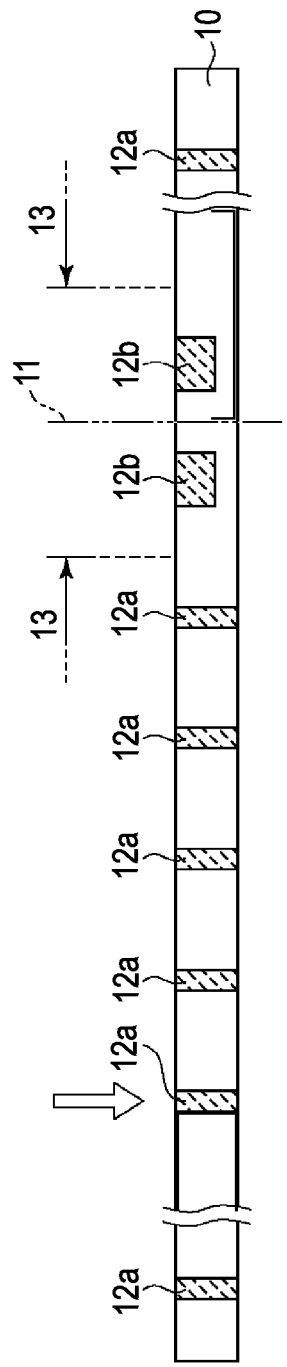 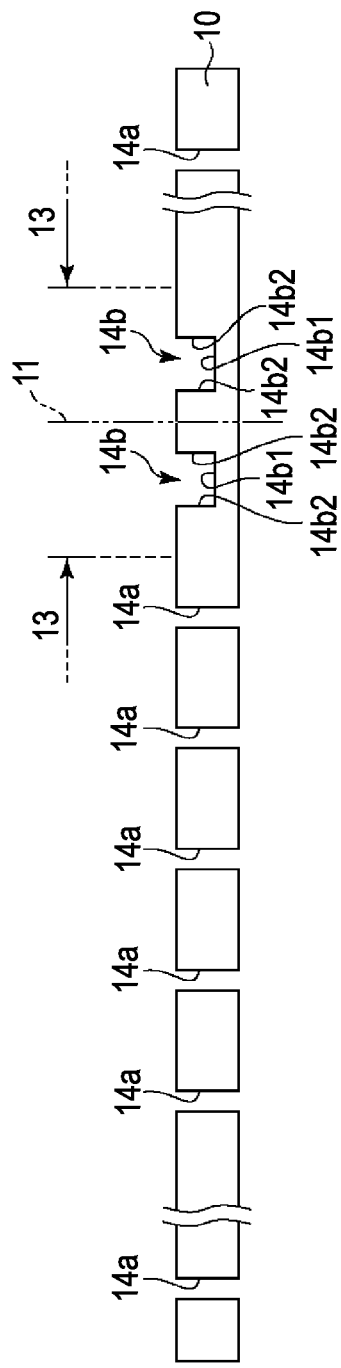

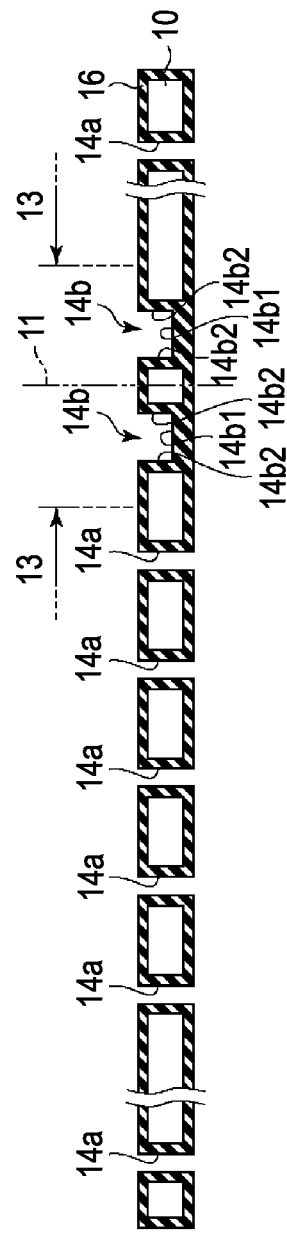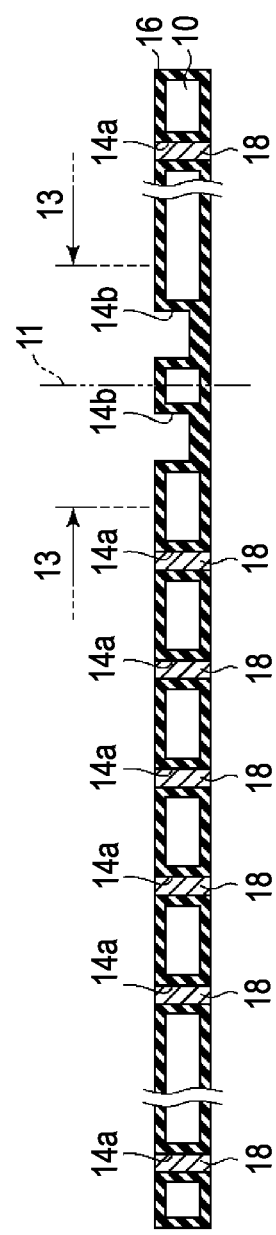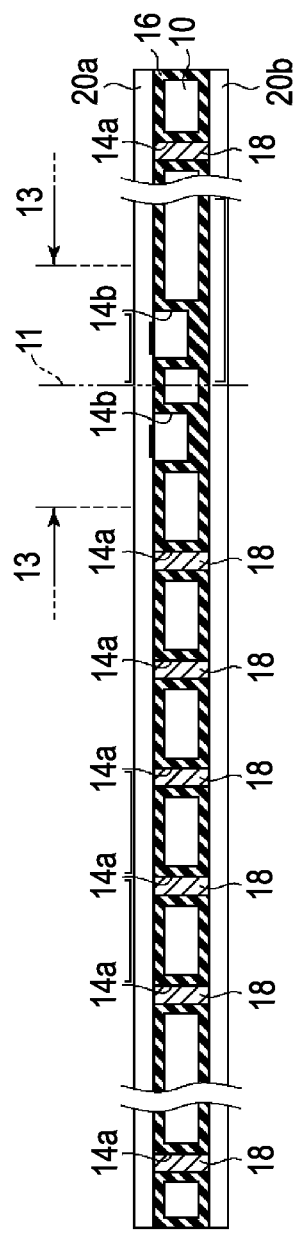

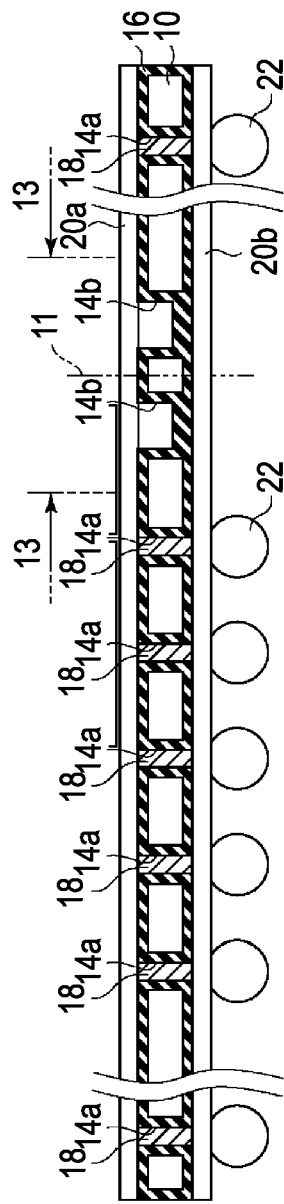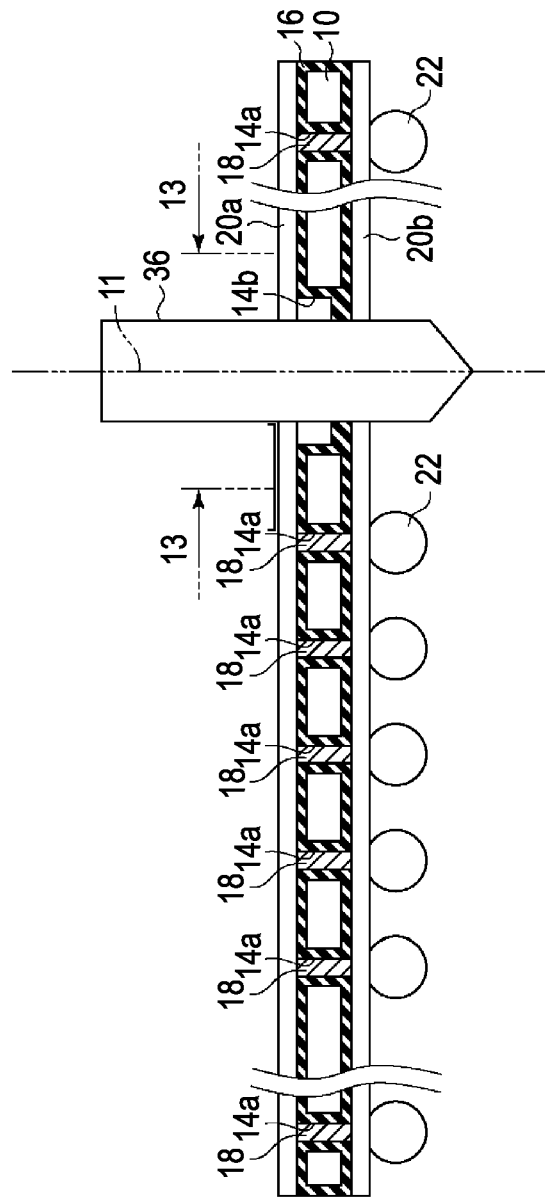
FIG.5A
FIG.5B

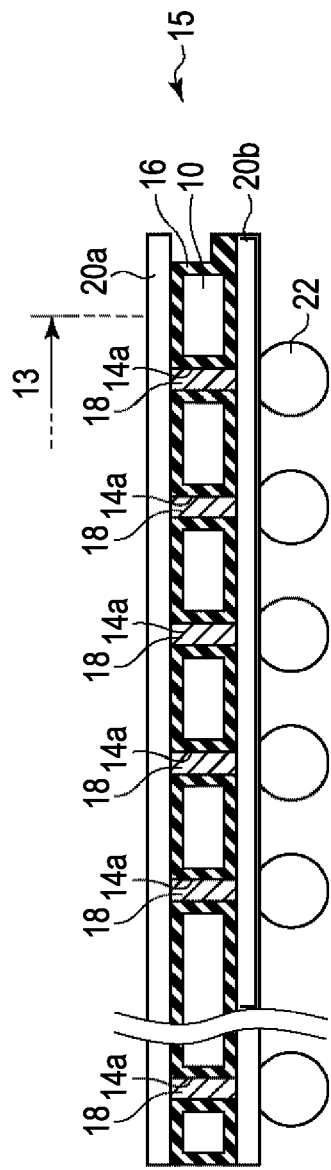
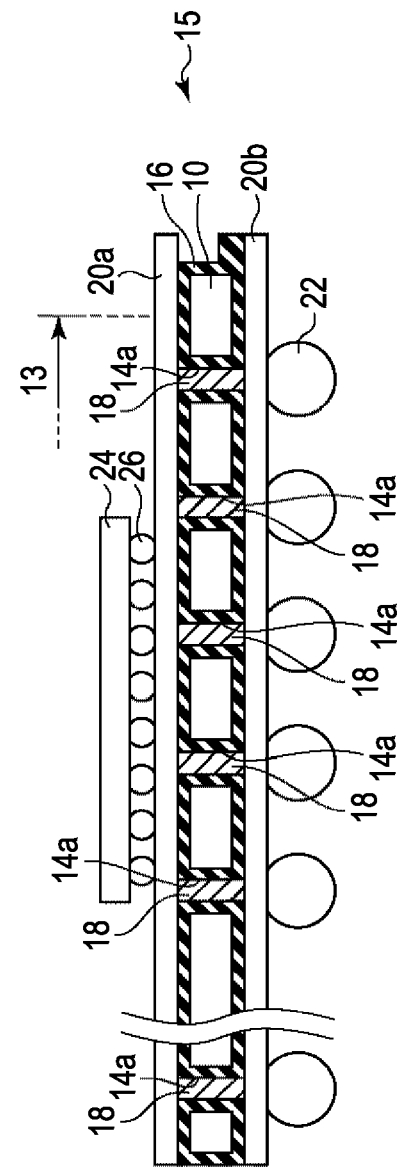
FIG.6A
FIG.6B

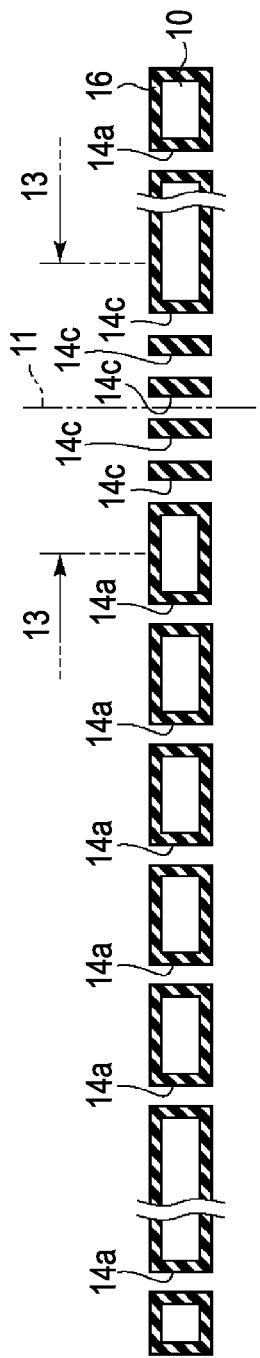
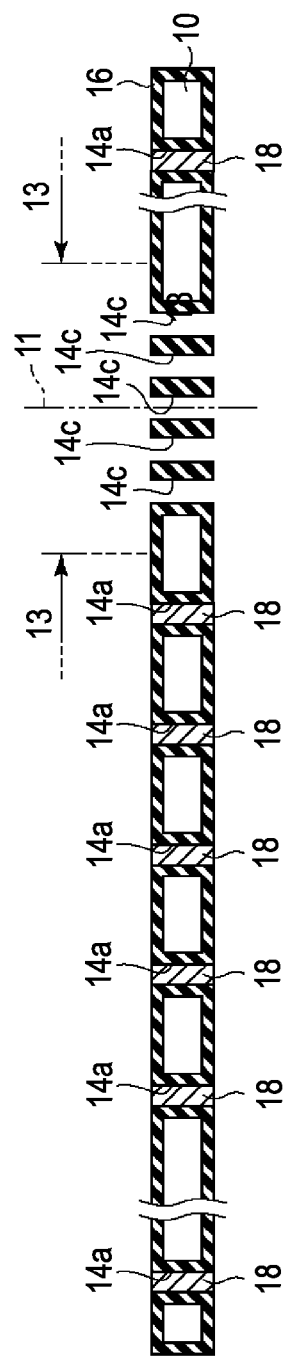
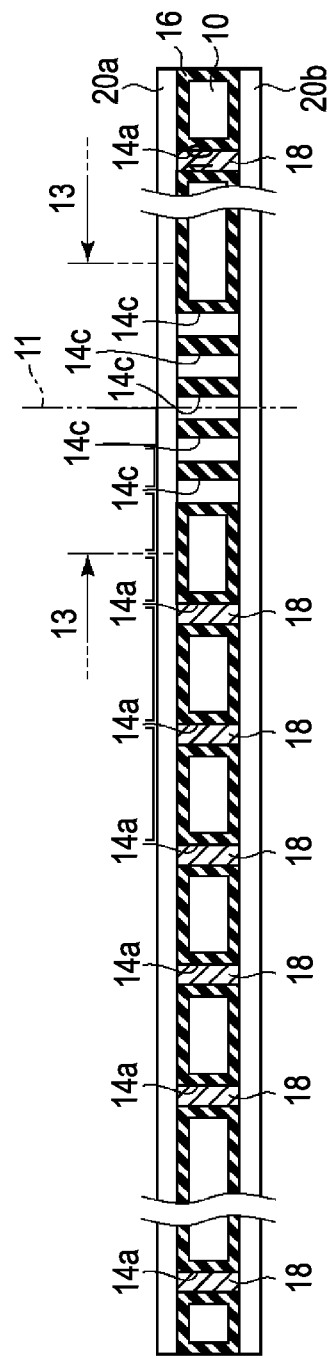
FIG.12A
FIG.12B
FIG.12C

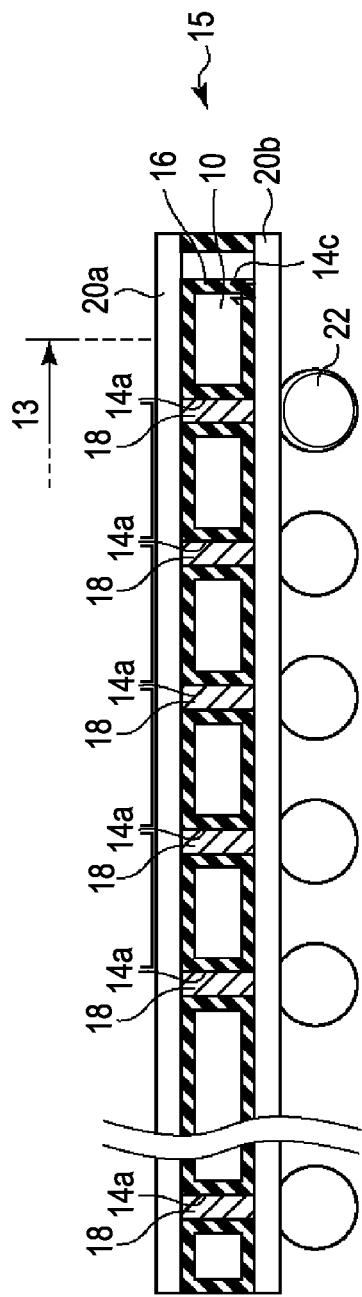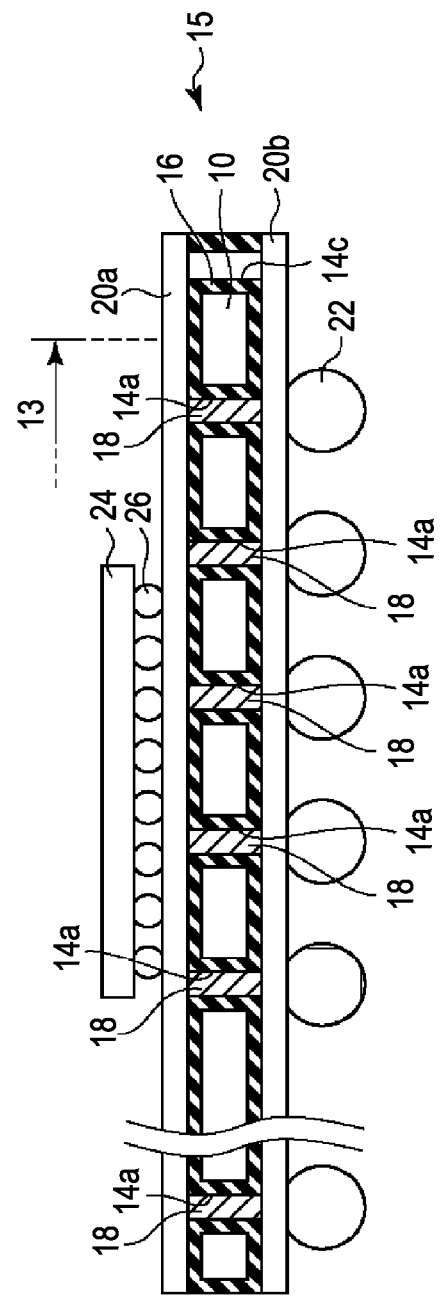
FIG.14A
FIG.14B

GLASSWORK COMPONENT, MANUFACTURING METHOD THEREOF, AND MANUFACTURING METHOD OF ELECTRONIC DEVICE

CROSS REFERENCE TO RELATED APPLICATIONS

This application is based on and claims priority under 35 U.S.C. §119 to Japanese Patent Application 2014-030577, filed on Feb. 20, 2014, the entire contents of which are incorporated herein by reference.

TECHNICAL FIELD

This disclosure relates to a glasswork component, a manufacturing method thereof, and a manufacturing method of an electronic device.

BACKGROUND DISCUSSION

In recent years, a technique for performing high integration of an electronic device using an interposer has attracted attention. For example, as the interposer, a silicon interposer is known which uses a silicon substrate in a core layer.

However, in the silicon interposer, the core layer is configured to have a semiconductor. For this reason, when vias are merely embedded into a through-hole by forming the through-hole in the core layer having the silicon substrate, the vias are short-circuited. Therefore, in the silicon interposer, it is necessary to form an insulating material on an inner wall of the through-hole in order to avoid short-circuit of the vias. Forming the insulating material on the inner wall of the through-hole is an obstructive factor in providing the interposer at low cost.

Therefore, a glass interposer which is the interposer using a glass substrate in the core layer has attracted attention. Since the glass substrate is configured to include an insulator, it is not necessary to form an insulating material on the inner wall of the through-hole. In addition, since the glass substrate is inexpensive compared to the silicon substrate, the glass substrate can contribute to lowered cost of the interposer.

JP 2013-102138A, JP 2012-166999A, JP 2013-537723A, and International Publication No. WO2011/132600 are respectively examples of Patent Reference in the related art.

Examples of the related art include: "3D Silicon & Glass Interposers", [online], 2012, Yole Developpement, [Jan. 27, 2014 Search], Internet (URL: http://www.i-micronews.com/upload/Rapports/3D_Silicon & Glass_Interposers_sample_2012.pdf); "Cost, Heat Dissipation, and Test: Solution to Three Big Issues of TSV", Nikkei Electronics, Apr. 16, 2012, p. 42-49; "Has 3 dimensional LSI disappeared?: "Regarding TSV Trends and Manufacturing Technology Innovation", Nikkei Electronics, Sep. 16, 2013, p. 36-51; John H. Lau, "Evolution, Challenge, and Outlook of TSV (Through-Silicon Via) and 3D IC/Si Integration", IEEE Japan ICEP, Apr. 13-15, 2011; and Ali Said, et al., "Fabrication of high-aspect ratio, micro-fluidic channels and tunnels using femtosecond laser pulses and chemical etching", 17 May 2004, Vol. 12, No. 10, Optics Express, p. 2120-2129.

However, in some cases, the glass interposer cannot necessarily obtain sufficiently high production yield since the glass substrate serving as the core layer is damaged during a dicing procedure. In addition, without being limited to the glass interposer, this problem is similarly applied to all of general glasswork components.

SUMMARY

Thus, a need exists for a glasswork component, a manufacturing method thereof which are not suspectable to the drawback mentioned above.

An aspect of this disclosure provides a manufacturing method of a glasswork component which includes forming a compressive stress layer which ranges from one main surface to the other main surface of a glass substrate, along a scheduled cutting line, so as to be adjacent to the scheduled cutting line of the glass substrate, and cutting the glass substrate in the scheduled cutting line.

Another aspect of this disclosure provides a glasswork component that is formed by forming a compressive stress layer which ranges from one main surface to the other main surface of a glass substrate, along a scheduled cutting line, so as to be adjacent to the scheduled cutting line of the glass substrate, and by cutting the glass substrate in the scheduled cutting line.

Still another aspect of this disclosure provides a manufacturing method of an electronic device which includes forming a compressive stress layer which ranges from one main surface to the other main surface of a glass substrate, along a scheduled cutting line, so as to be adjacent to the scheduled cutting line of the glass substrate, cutting the glass substrate in the scheduled cutting line, and mounting a semiconductor device on the glass substrate.

Yet another aspect of this disclosure provides an electronic device which includes a glasswork component that is formed by forming a compressive stress layer which ranges from one main surface to the other main surface of a glass substrate, along a scheduled cutting line, so as to be adjacent to the scheduled cutting line of the glass substrate, and by cutting the glass substrate in the scheduled cutting line, and a semiconductor device that is mounted on the glasswork component.

BRIEF DESCRIPTION OF THE DRAWINGS

The foregoing and additional features and characteristics of this disclosure will become more apparent from the following detailed description considered with the reference to the accompanying drawings, wherein:

FIGS. 3A to 3C are process cross-sectional views (Part 1) illustrating a manufacturing method of a glasswork component and a manufacturing method of an electronic device using the glasswork component according to a first embodiment disclosed here;

FIGS. 4A to 4C are process cross-sectional views (Part 2) illustrating the manufacturing method of the glasswork component and the manufacturing method of the electronic device using the glasswork component according to the first embodiment disclosed here;

FIGS. 5A and 5B are process cross-sectional views (Part 3) illustrating the manufacturing method of the glasswork component and the manufacturing method of the electronic device using the glasswork component according to the first embodiment disclosed here;

FIGS. 6A and 6B are process cross-sectional views (Part 4) illustrating the manufacturing method of the glasswork component and the manufacturing method of the electronic device using the glasswork component according to the first embodiment disclosed here;

FIGS. 12A to 12C are process cross-sectional views (Part 2) illustrating the manufacturing method of the glasswork component according to the second embodiment disclosed here;

FIGS. 14A and 14B are process cross-sectional views (Part 4) illustrating the manufacturing method of the glasswork component according to the second embodiment disclosed here.

DETAILED DESCRIPTION

Figure 1:
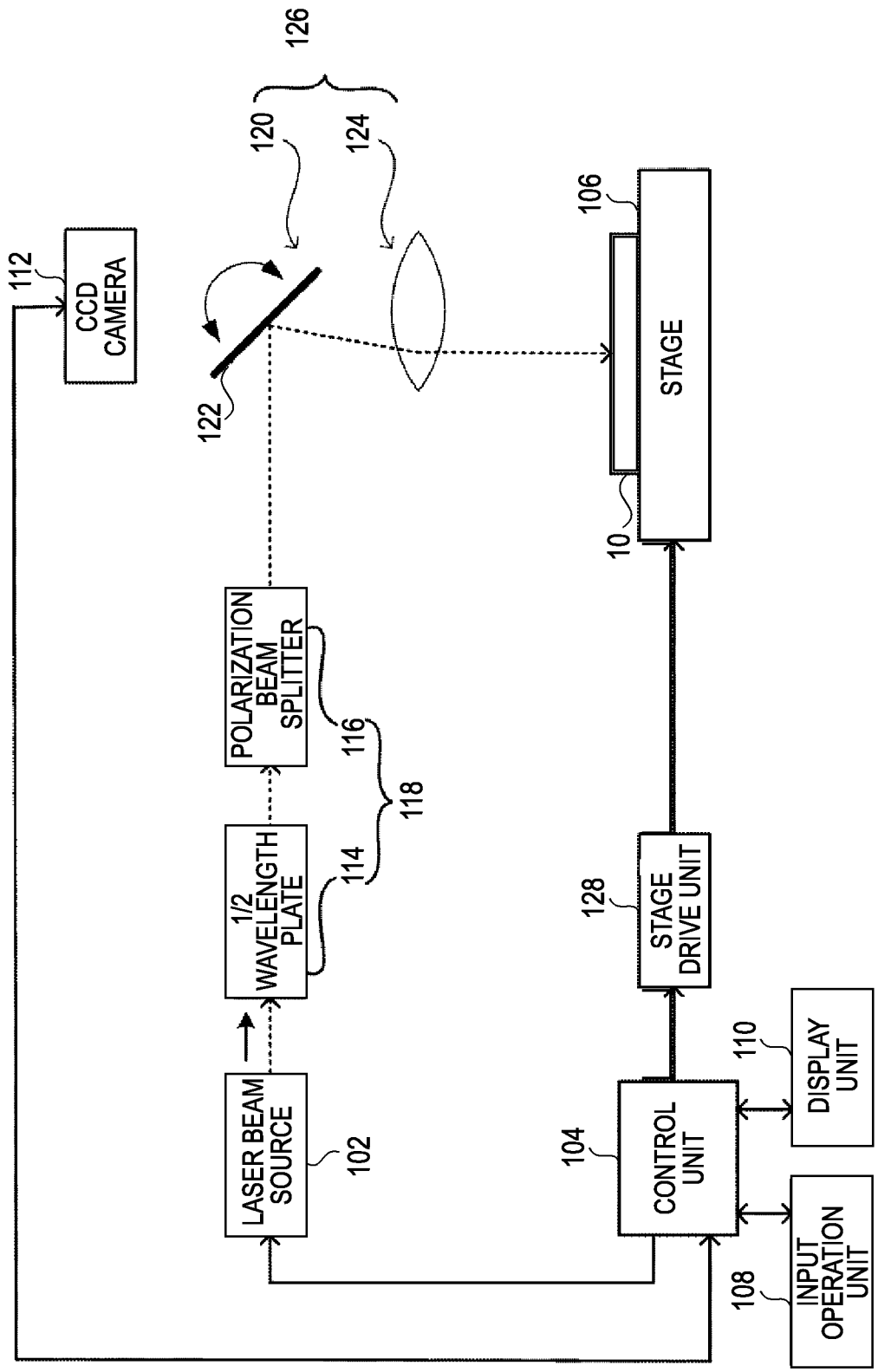
FIG. 1 is a schematic diagram illustrating an example of a laser processing apparatus.

Hereinafter, embodiments disclosed here will be described with reference to the accompanying drawings. This disclosure is not limited to the following embodiments, but can be appropriately modified within the scope not departing from the gist of this disclosure. In addition, in the drawings to be illustrated here, the same reference numerals are given to configuration elements having the same function, and description thereof will be omitted or simplified.

First Embodiment

A glasswork component, a manufacturing method thereof, an electronic device, and a manufacturing method thereof according to a first embodiment disclosed here will be described with reference to the drawings.

Laser Processing Apparatus

First, a laser processing apparatus will be described which is used when manufacturing the glasswork component and the electronic device according to the embodiment disclosed here. FIG. 1 is a schematic diagram illustrating an example of the laser processing apparatus. In FIG. 1, connection between respective configuration elements is illustrated by a solid line, and an optical path of laser beams is illustrated by a broken line.

A laser processing apparatus 100 has a laser beam source 102 which emits laser beams, a control unit 104 which controls the overall laser processing apparatus 100, and a stage 106 on which a workpiece 10 serving as a processing target is placed. For example, the workpiece 10 includes a substrate (glass substrate).

The laser processing apparatus 100 can reform the workpiece 10 by emitting the laser beams onto a surface of the workpiece 10.

The control unit 104 has a CPU (not illustrated) which executes processing of various calculations, controls, and determinations. In addition, the control unit 104 has a ROM (not illustrated) which stores various control programs executed by the CPU. In addition, the control unit 104 has a RAM (not illustrated) which temporarily stores CPU processing data or input data.

An input operation unit 108 for a user to input a predetermined command or data is connected to the control unit 104. For example, as the input operation unit 108, a keyboard or various switches are used.

A display unit 110 for various displays is connected to the control unit 104. For example, the display unit 110 displays an operation state of the laser processing apparatus 100, a state of the stage 106, and an image acquired by a CCD camera 112. For example, as the display unit 110, a liquid crystal display is used.

The laser beam source 102 emits the laser beams. Here, as the laser beams, ultra-short pulse laser beams are used. For example, as the ultra-short pulse laser beams, femtosecond laser beams are used. In general, the femtosecond laser beams are pulse laser beams whose pulse width is in the order of femtoseconds (fs: $10^{-15}$ seconds), that is, the pulse laser beams whose pulse width is 1 fs or more and less than 1 ps. The pulse laser beams whose pulse width is in the order of femtoseconds are emitted from the laser beam source 102. In the embodiment disclosed here, for example, as the laser beam source 102, a laser oscillator is used in which a central wavelength is approximately 1045 nm and the pulse width is approximately 700 fs. For example, power of the ultra-short pulse laser beams emitted from the laser beam source 102 is approximately 50 mW to 20 W.

Here, a case where the pulse width of the laser beams is approximately 700 fs has been described as an example, but the pulse width of the laser beams is not limited to approximately 700 fs. In addition, the pulse width of the laser beams is not strictly limited to the order of the femtoseconds, but may be in the order of picoseconds. Within the scope of this disclosure, without being limited to the laser beams whose pulse width is in the order of femtoseconds, the ultra-short pulse laser beams also include picosecond laser beams whose pulse width is equal to or less than several tens of picoseconds.

The central wavelength of the laser beam source 102 is also not limited to approximately 1045 nm, but can be appropriately set.

The power of the ultra-short pulse laser beams emitted from the laser beam source 102 is not also limited to approximately 50 mW to 20 W, but can be appropriately set.

The laser beam source 102 is controlled by the control unit 104. The pulse width of the ultra-short pulse laser beams emitted from the laser beam source 102 can be appropriately set by a user via the input operation unit 108. Various setting information items input by the user are appropriately stored in a storage unit (not illustrated) disposed in the control unit 104. The control unit 104 controls the laser beam source 102 so that the ultra-short pulse laser beams emitted from the laser beam source 102 are emitted to the workpiece 10.

A ½ wavelength plate 114 which controls a polarization direction of the ultra-short pulse laser beams is disposed at a rear stage of the laser beam source 102 emitting the ultra-short pulse laser beams. A polarization beam splitter 116 which adjusts an output of the ultra-short pulse laser beams is disposed at a rear stage of the ½ wavelength plate 114. If the polarization direction of the laser beams is changed by rotating the ½ wavelength plate 114, a ratio of deflection components to be branched in the polarization beam splitter 116 is changed. It is possible to appropriately adjust the power of the ultra-short pulse laser beams emitted from the polarization beam splitter 116 by appropriately adjusting a rotation angle of the ½ wavelength plate 114. An output attenuator 118 is configured to include the ½ wavelength plate 114 and the polarization beam splitter 116 which are in cooperation with each other. In this manner, laser intensity of the ultra-short pulse laser beams emitted from the laser beam source 102 can be adjusted by the output attenuator 118. The laser intensity of the ultra-short pulse laser beams can be appropriately set by the user via the input operation unit 108.

Here, a case where the laser intensity of the ultra-short pulse laser beams is adjusted by using the output attenuator 118 configured to include the ½ wavelength plate 114 and the polarization beam splitter 116 has been described as an example. However, means for adjusting the laser intensity of the ultra-short pulse laser beams is not limited thereto. It is possible to appropriately adjust the laser intensity of the ultra-short pulse laser beams by using any desired adjusting means.

A galvanoscanner 120 is arranged at a rear stage of the output attenuator 118. The galvanoscanner 120 is an optical device which enables the laser beams to scan the workpiece 10 at high speed by appropriately changing a mirror angle. The ultra-short pulse laser beams introduced to the galvanoscanner 120 are reflected on a mirror 122 of the galvanoscanner 120, and are introduced to an F8 (F-Theta) lens 124. The F8 lens 124 is a lens used in laser scanning, and is a lens having a function of scanning an imaging surface at constant speed by using the laser beams reflected on the rotating mirror at an equal angle. A scanning optical system 126 for two-dimensional scanning using the ultra-short pulse laser beams is configured to include the galvanoscanner 120 and the F8 lens 124 which are in cooperation with each other. The scanning optical system 126 is appropriately controlled by the control unit 104.

The stage 106 is located below the Fθ lens 124. The workpiece 10 is placed on the stage 106. A stage drive unit 128 for driving the stage 106 is connected to the stage 106. The control unit 104 drives the stage 106 via the stage drive unit 128. The stage 106 may be an XY axis stage, an XYZ axis stage, or an XYZθ axis stage.

As described above, the laser processing apparatus 100 can emit the ultra-short pulse laser beams to a desired site of the workpiece 10, or can scan the workpiece 10 by using the ultra-short pulse laser beams.

The laser processing apparatus 100 emits the ultra-short pulse laser beams to the workpiece 10, thereby enabling the workpiece 10 to be reformed. For example, ambient atmosphere around the workpiece 10 is the atmosphere (air).

The CCD camera 112 is disposed above the stage 106. An image acquired by the CCD camera 112 is input to the control unit 104. The control unit 104 performs positioning of the workpiece 10 by using the image acquired by the CCD camera 112.

In the embodiment disclosed here, a case where the ultra-short pulse laser beams are emitted to the desired site of the workpiece 10 by using the scanning optical system 126 including the galvanoscanner 120 has been described as an example, but the embodiment disclosed here is not limited thereto. For example, the ultra-short pulse laser beams may be emitted to the desired site of the workpiece 10 by using a mirror (not illustrated) and a condenser lens (not illustrated) and by appropriately controlling the stage 106.

Before the scanning of the workpiece 10 using the laser beams is started, a position of the workpiece 10 is set to a predetermined position. The control unit 104 appropriately controls the stage 106 via the stage drive unit 128 so as to position the workpiece 10 within an allowable scanning range using the laser beams of the scanning optical system 126.

For example, the scanning of the workpiece 10 using the laser beams is performed by controlling the scanning optical system 126. For example, the scanning optical system 126 is controlled by the control unit 104. The scanning optical system 126 scans the workpiece 10 using the laser beams by appropriately rotating the mirror 122 of the galvanoscanner 120.

A diameter of an emitting-targeted spot of the ultra-short pulse laser beams can be appropriately set by the user via the input operation unit 108. The diameter of the emitting-targeted spot of the ultra-short pulse laser beams can be adjusted by raising or lowering the stage 106 in a normal direction on an upper surface of the stage 106. For example, the diameter of the emitting-targeted spot of the ultra-short pulse laser beams is appropriately set within a range of several μm to several tens of μm.

The diameter of the emitting-targeted spot of the ultra-short pulse laser beams is not also limited to the range of several μm to several tens of μm, but can be set appropriately.

A scheduled site for emitting the ultra-short pulse laser beams is programmed in the control unit 104 in advance.

For example, when the scanning of the workpiece 10 using the laser beams is started, the user instructs the control unit 104 to start the scanning using the laser beams via the input operation unit 108.

If the instruction to start the scanning using the laser beams is input, the control unit 104 performs the scanning using the laser beams in the following manner.

That is, if the control unit 104 forms a reformation portion in a band shape, the control unit 104 causes the laser beam source 102 to repeatedly emit the ultra-short pulse laser beams and causes the scanning optical system 126 to scan the workpiece 10 using the laser beams. In this manner, the workpiece 10 is scanned using the laser beams so that the laser beams draw a desired trajectory on the stage 106, thereby forming the reformation portion into the band shape in the workpiece 10.

If the control unit 104 forms the reformation portion in a columnar shape, the control unit 104 sets the scanning optical system 126 so as to scan a predetermined site of the workpiece 10 using the laser beams, and causes the laser beam source 102 to emit the ultra-short pulse laser beams. In this manner, the reformation portion in the columnar shape is formed at the predetermined site of the workpiece 10.

If the scanning using the laser beams is completed in the overall scheduled region for laser emitting, the control unit 104 causes the laser beam source 102 to complete the emitting of the ultra-short pulse laser beams, and causes the scanning optical system 126 to complete the scanning using the laser beams.

The scanning using the laser beams may be completed in such a way that the user instructs the control unit 104 to complete the scanning using the laser beams via the input operation unit 108.

Glasswork Component, Manufacturing Method Thereof, Electronic Device, and Manufacturing Method Thereof Next, a glasswork component, a manufacturing method thereof, an electronic device using the glasswork component, and a manufacturing method thereof according to an embodiment disclosed here will be described with reference to the drawings.

In the embodiment disclosed here, a case where a glass substrate used for an electronic component is cut, more specifically, a case where a glass substrate used as a core layer of an interposer is cut will be described as an example. However, the embodiment disclosed here is not limited thereto. This disclosure can be widely employed when manufacturing various glasswork components using the glass substrate.

Figure 2:
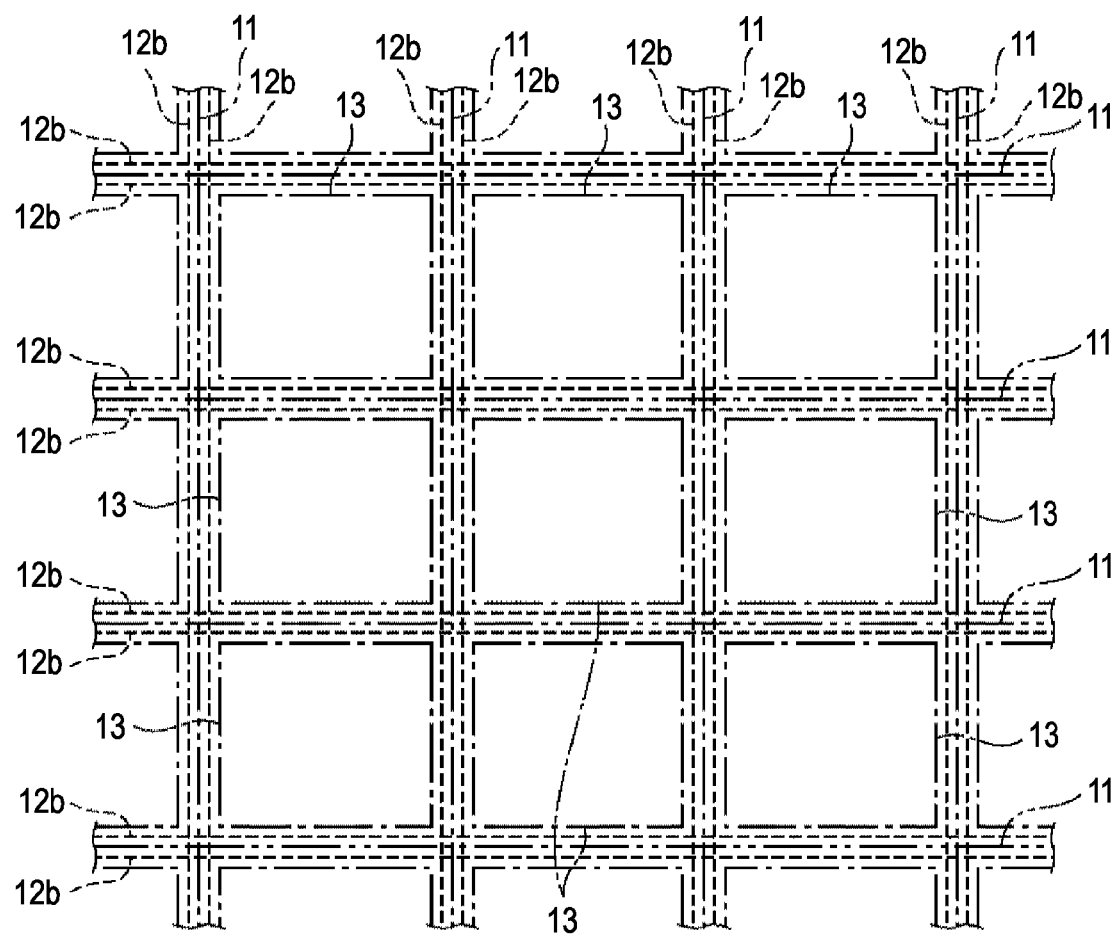
FIG. 2 is a plan view illustrating a relationship among a scheduled cutting line, a reformation portion, and a functional region.

FIG. 2 is a plan view illustrating a relationship among a scheduled cutting line, a reformation portion, and a functional region.

The interposer according to the embodiment disclosed here is manufactured by cutting and dicing the glass substrate 10 along a scheduled cutting line 11, after various configuration elements of an interposer 15 are formed in multiple functional regions 13 inside the glass substrate 10.

The scheduled cutting line 11 is located between the functional regions 13 adjacent to each other. A reformation portion 12b is formed so as to be adjacent to the scheduled cutting line 11 and so as to extend along the scheduled cutting line 11. The reformation portion 12b is located between the scheduled cutting line 11 and the functional region 13. The functional region 13 is a region excluding a peripheral edge portion of the glass substrate 10 (refer to FIG. 5B) after the glass substrate 10 is cut, and is a region where the various configuration elements configuring the interposer are formed. The various configuration elements of the interposer 15 such as vias 18 (refer to FIGS. 6A and 6B) and multilayer wiring structures 20a and 20b (refer to FIGS. 6A and 6B) are formed inside the functional region 13.

FIGS. 3A to 6B are process cross-sectional views illustrating the manufacturing method of the glasswork component according to the embodiment disclosed here and the manufacturing method of the electronic device using the glasswork component.

As illustrated in FIG. 3A, the substrate 10 is first prepared. For example, as the substrate 10, the glass substrate is used. The thickness of the glass substrate 10 is approximately 30 μm to 100 μm, for example.

As illustrated in FIG. 3B, then, reformation portions 12a and 12b are formed by emitting laser beams to the glass substrate 10. The reason for forming the reformation portions 12a and 12b in the glass substrate 10 is that the reformation portions 12a and 12b can be etched selectively.

The reformation portion 12a serves to form a through-hole 14a. Therefore, the reformation portion 12a is formed in a scheduled site for forming the through-hole 14a. A shape of the reformation portion 12a is the same as a shape of the through-hole 14a. Here, the shape of the reformation portion 12a is a columnar shape, for example. The reformation portion 12a is formed so as to range from one main surface to the other main surface of the glass substrate 10. That is, the reformation portion 12a is formed so as to penetrate the glass substrate 10. A diameter of the reformation portion 12a is within several μm to several tens of μm, for example. Here, the diameter of the reformation portion 12a is approximately 10 μm to 20 μm, for example.

The diameter of the reformation portion 12a can be adjusted by appropriately setting a diameter of the emitting-targeted spot of the ultra-short pulse laser beams. The diameter of the emitting-targeted spot of the ultra-short pulse laser beams may be appropriately adjusted by forming the reformation portion 12a having a desired diameter, and so that the through-hole 14a having a desired diameter can be additionally obtained.

The reformation portion 12b serves to form a groove-shaped recess 14b. Therefore, the reformation portion 12b is formed in a scheduled site for forming the groove-shaped recess 14b. A shape of the reformation portion 12b is the same as a shape of the groove-shaped recess 14b. Here, the shape of the reformation portion 12b is a band shape, for example. The thickness of the reformation portion 12b is set to be thinner than the thickness of the glass substrate 10. That is, the reformation portion 12b is formed so as not to penetrate the glass substrate 10. If the reformation portion 12b is formed so as to penetrate the glass substrate 10, when the reformation portion 12b is etched and removed selectively, the respective functional regions 13 are separated from each other. For this reason, the multiple functional regions 13 cannot be processed collectively. A width of the reformation portion 12b is within several μm to several tens of μm, for example. Here, the thickness of the reformation portion 12b is within several μm to several tens of μm, for example. A distance between a central line in a longitudinal direction of the reformation portion 12b located on one side of the scheduled cutting line 11 and a central line in the longitudinal direction of the reformation portion 12b located on the other side of the scheduled cutting line 11 is within several tens of μm to several hundreds of μm, for example.

The width of the reformation portion 12b can be adjusted by appropriately setting the diameter of the emitting-targeted spot of the ultra-short pulse laser beams. The diameter of the emitting-targeted spot of the ultra-short pulse laser beams may be appropriately adjusted by forming the reformation portion 12b having a desired width, and so that the recess 14b having a desired width can be additionally obtained.

The thickness of the reformation portion 12b can be adjusted by appropriately setting emitting intensity and an emitting time period of the ultra-short pulse laser beams. The emitting intensity and the emitting time period of the ultra-short pulse laser beams may be appropriately adjusted by forming the reformation portion 12b having a desired thickness, and so that the recess 14b having a desired depth can be additionally obtained.

As illustrated in FIG. 3C, then, the reformation portions 12a and 12b are etched and removed selectively. Since an etching rate of the reformation portions 12a and 12b is significantly faster than that of the glass substrate 10 within portions which are not reformed, it is possible to etch the reformation portions 12a and 12b selectively. If the reformation portion 12a is etched and removed, the through-hole 14a is formed in the site. The through-hole 14a serves to embed the via 18 therein in a subsequent process. The diameter of the through-hole 14a is several μm to several tens of μm, for example. In addition, if the reformation portion 12b is etched and removed, the groove-shaped recess 14b is formed in a region adjacent to the scheduled cutting line 11 so as to extend along the scheduled cutting line 11. The width of the groove-shaped recess 14b is several μm to several tens of μm, for example. The thickness between a bottom surface 14b1 of the groove-shaped recess 14b and a lower surface of the glass substrate 10 is several μm to several tens of μm, for example. Preferably, the thickness of the glass substrate 10 present below the groove-shaped recess 14b is thinner than twice the thickness of a compressive stress layer 16 which is to be formed in the subsequent process. The reason for setting the thickness of the glass substrate 10 remaining below the groove-shaped recess 14b in this way is that the compressive stress layer 16 can be formed so as to penetrate the glass substrate 10 in the subsequent process.

Next, the compressive stress layer 16 is formed in a surface layer of the glass substrate 10 by using an ion-exchange method (refer to FIG. 4A). Specifically, the glass substrate 10 is immersed in a chemical solution for ion-exchange. For example, as the chemical solution, the chemical solution in which potassium nitrate ($KNO_3$) is dissolved is used. If the glass substrate 10 containing sodium (Na) is immersed in this chemical solution, sodium ion on the surface of the glass substrate 10 and potassium ion contained in the chemical solution are exchanged with each other so that the potassium ion permeates the surface layer of the glass substrate 10. The potassium ion is greater than the sodium ion. Accordingly, the compressive stress layer 16 is formed in the surface layer of the glass substrate 10. The treatment for forming the compressive stress layer 16 in the surface layer of the glass substrate 10 is intended to strengthen the glass substrate 10 through chemical treatment. Therefore, the treatment is called a chemically strengthening treatment. Then, the compressive stress layer 16 is also called a chemically strengthened layer.

For example, the temperature of the chemical solution used in the chemically strengthening treatment is 350° C. to 500° C. For example, a time period required for the chemically strengthening treatment is one hour to 12 hours. For example, if the temperature of the chemical solution is 400° C. to 450° C. and the treatment time period is one hour to four hours, the compressive stress layer 16 in which a magnitude of the compressive stress is 500 MPa or greater can be formed with the thickness of approximately 1 μm to 30 μm.

In the site having the groove-shaped recess 14b, the thickness is thin between the bottom surface 14b1 of the groove-shaped recess 14b and the lower surface of the glass substrate 10. For this reason, in the site having the groove-shaped recess 14b, the ion-exchange occurs in the entire site, and the compressive stress layer 16 is formed in the entire site. Therefore, on a side wall 14b2 of the groove-shaped recess 14, the compressive stress layer 16 is formed so as to range from one main surface to the other main surface of the glass substrate 10.

Figure 7:
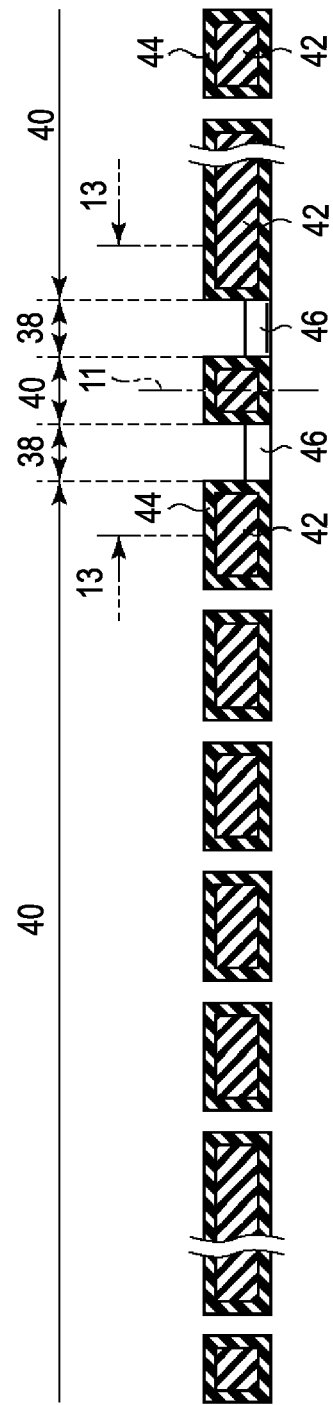
FIG. 7 is a cross-sectional view illustrating stress distribution.

FIG. 7 is a cross-sectional view illustrating stress distribution. FIG. 7 illustrates the stress distribution corresponding to a structure illustrated in FIG. 4A.

As illustrated in FIG. 7, a region indicated by a reference numeral 40 within the glass substrate 10 is configured so that a tensile stress region 42 is present inside a compressive stress region 44 serving as the compressive stress layer 16. Since the compressive stress region 44 and the tensile stress region 42 are present, the glass substrate 10 is strengthened in the region 40.

In contrast, a region indicated by a reference numeral 38 within the glass substrate 10 is a region where all are ion-exchanged. That is, the region 38 is not configured so that the tensile stress region 42 is present inside the compressive stress region 44. Therefore, the region 38 is a low residual stress region (less strengthened region) 46.

As illustrated in FIG. 4B, then, the via (conductor) 18 is embedded into the through-hole 14a. For example, as a material for the via 18, copper (Cu) is used. For example, it is possible to embed the via 18 into the through-hole 14a by using an electroless plating method and an electroplating method.

As illustrated in FIG. 4C, then, the multilayer wiring structures 20a and 20b are respectively formed on the upper surface side and the lower surface side of the glass substrate 10. The multilayer wiring structures 20a and 20b are formed by stacking wiring layers (not illustrated) on one another via an interlayer insulation layer (not illustrated). For example, as the interlayer insulation layer, an interlayer insulating film can be used. For example, as the interlayer insulating film, an Ajinomoto Build-up Film (ABF) produced by Ajinomoto Co., Inc. is used. For example, the wiring layer can be formed by using the electroless plating method and the electroplating method.

As illustrated in FIG. 5A, then, for example, a solder bump 22 is formed on the lower surface side of the multilayer wiring structure (build-up layer) 20b. The solder bump 22 is connected to an electrode pad (not illustrated) formed on the lower surface side of the multilayer wiring structure (build-up layer) 20b.

As illustrated in FIG. 5B, then, the glass substrate 10 is cut in the scheduled cutting line 11 by using a dicing blade 36 (refer to FIG. 2). As described above, the compressive stress layer 16 which ranges from one main surface to the other main surface of the glass substrate 10 is formed between the scheduled cutting line 11 and the functional region 13. Therefore, the glass substrate 10 is strengthened in the site. Accordingly, when the glass substrate 10 is cut in the scheduled cutting line 11, even if cracks occur on the glass substrate 10, it is possible to prevent the cracks from reaching the functional region 13.

In this manner, the glasswork component 15 according to the embodiment disclosed here, that is, the interposer 15 according to the embodiment disclosed here is manufactured (refer to FIG. 6A).

As illustrated in FIG. 6B, thereafter, a semiconductor device 24 is mounted on the interposer 15 according to the embodiment disclosed here. The semiconductor device 24 and the interposer 15 are electrically connected to each other by using a solder bump 26. More specifically, an electrode pad (not illustrated) formed on the lower surface of the semiconductor device 24 and an electrode pad (not illustrated) formed on the upper portion of the multilayer wiring structure 20a of the interposer 15 are electrically connected to each other via the solder bump 26.

In this manner, the electronic device according to the embodiment disclosed here is manufactured.

The electronic device may be configured in such a way that the interposer or the semiconductor device is appropriately further stacked thereon.

As described above, according to the embodiment disclosed here, the compressive stress layer 16 which ranges from one main surface to the other main surface of the glass substrate 10 is formed so as to be adjacent to the scheduled cutting line 11 of the glass substrate 10, and so as to extend along the scheduled cutting line 11. Therefore, according to the embodiment disclosed here, the strengthened site of the glass substrate 10 is generated in the site which is adjacent to the scheduled cutting line 11 and which extends along the scheduled cutting line 11. Therefore, according to the embodiment disclosed here, when the glass substrate 10 is cut in the scheduled cutting line 11, even if cracks occur on the glass substrate 10 in the scheduled cutting line 11, it is possible to prevent the cracks from reaching the functional region 13 of the glasswork component. Accordingly, according to the embodiment disclosed here, even when the glass substrate 10 is used, it is possible to obtain high production yield.

Modification Example

Figure 8:
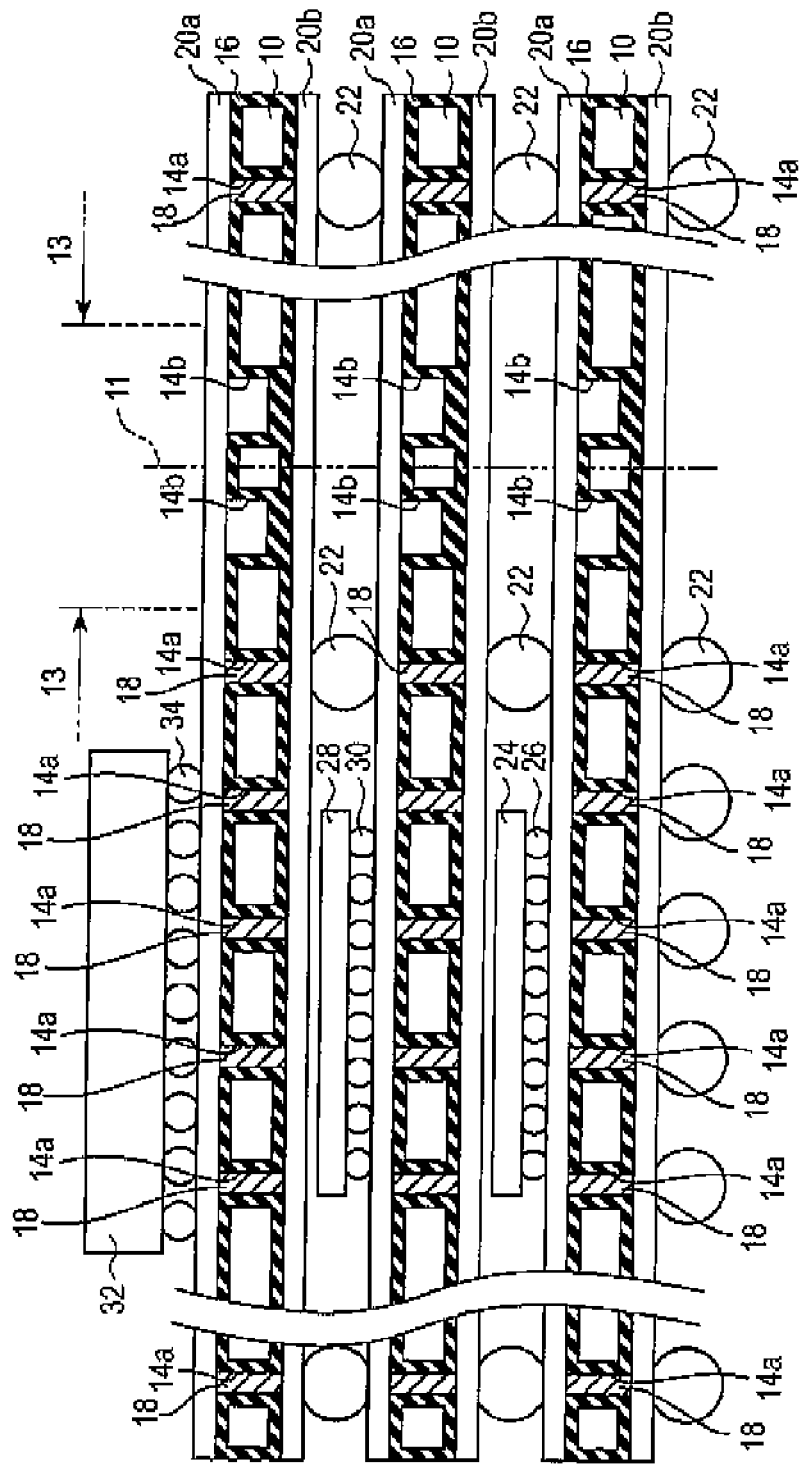
FIG. 8 is a process cross-sectional view (Part 1) illustrating a manufacturing method of an electronic device according to a modification example of the first embodiment disclosed here.
Figure 9:
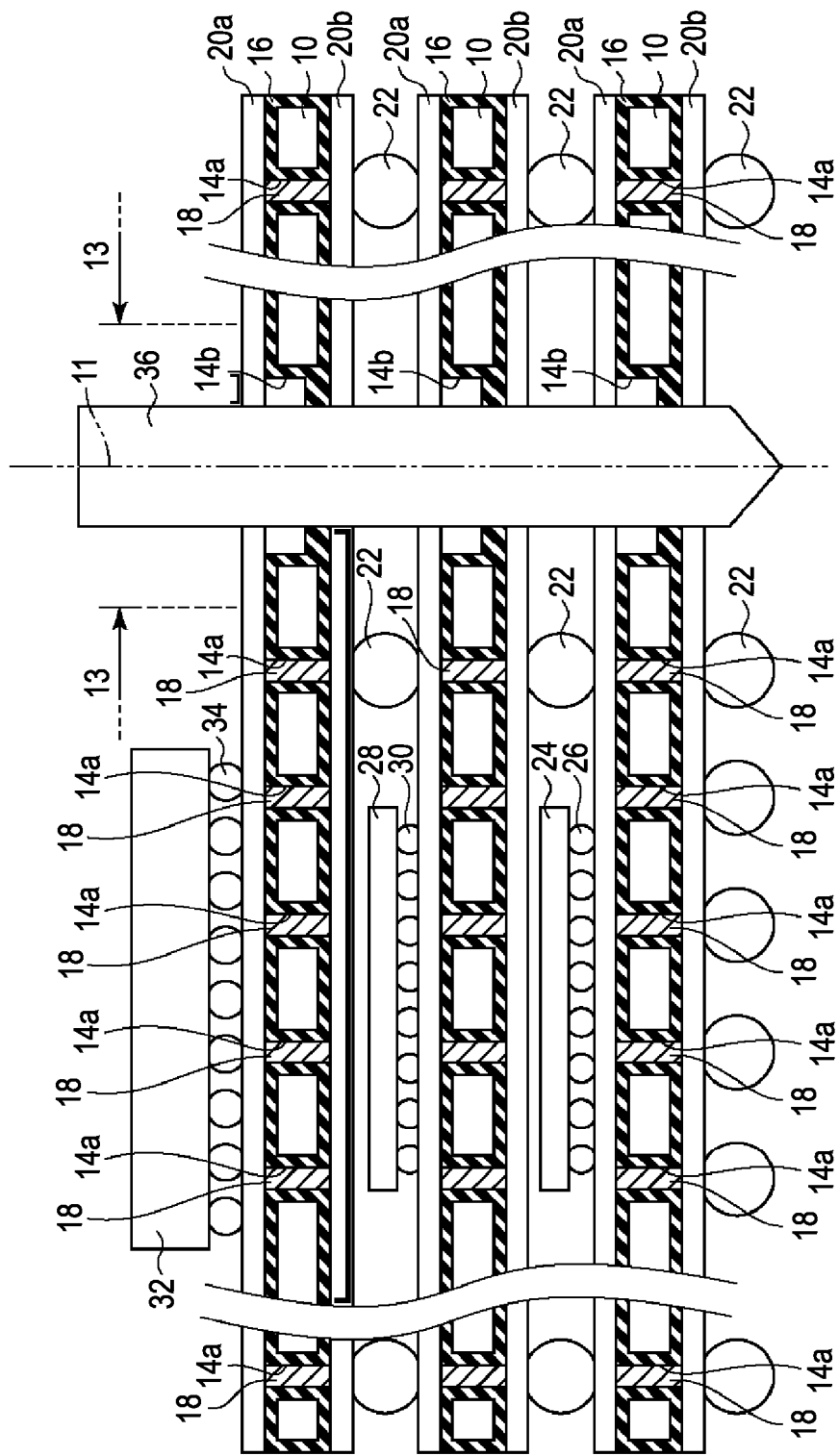
FIG. 9 is a process cross-sectional view (Part 2) illustrating the manufacturing method of the electronic device according to the modification example of the first embodiment disclosed here.
Figure 10:
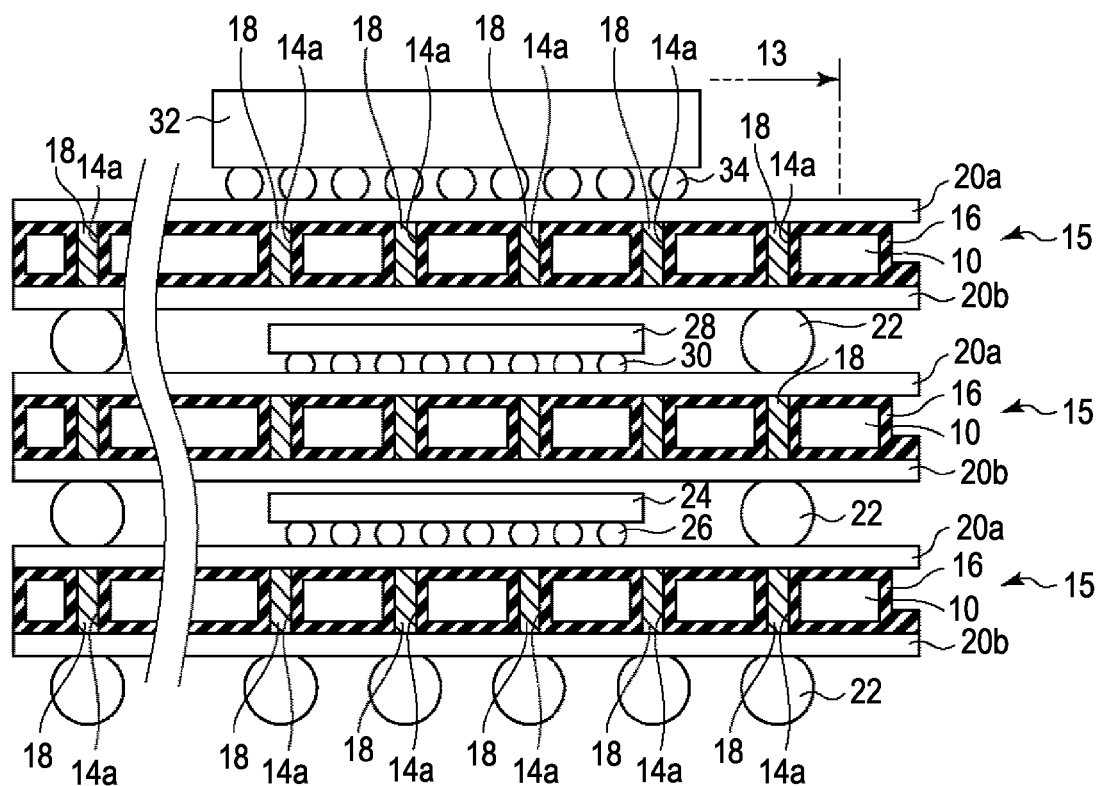
FIG. 10 is a process cross-sectional view (Part 3) illustrating the manufacturing method of the electronic device according to the modification example of the first embodiment disclosed here.

Next, a modification example of the manufacturing method of the electronic device according to the embodiment disclosed here will be described. FIGS. 8 to 10 are process cross-sectional views illustrating a manufacturing method of an electronic device according to the modification example.

In a manufacturing method of a glasswork component according to the modification example, after multiple glass substrates 10 respectively having multiple interposers 15 are stacked on one another, the multiple stacked glass substrates 10 are collectively cut in the scheduled cutting line 11.

First, a stacked body as illustrated in FIG. 8 is formed. That is, the semiconductor device 24 is mounted on the multilayer wiring structure 20a of the first stage glass substrate 10 (refer to FIG. 8). The electrode pad (not illustrated) formed on the lower surface of the semiconductor device 24 and the electrode pad (not illustrated) formed on the upper portion of the multilayer wiring structure 20a of the first stage glass substrate 10 are electrically connected to each other via the solder bump 26. In addition, a semiconductor device 28 is mounted on the multilayer wiring structure 20a of the second stage glass substrate 10. An electrode pad (not illustrated) formed on the lower surface of the semiconductor device 28 and an electrode pad (not illustrated) formed on the upper portion of the multilayer wiring structure 20a of the second stage glass substrate 10 are electrically connected to each other via a solder bump 30. In addition, a semiconductor device 32 is mounted on the multilayer wiring structure 20a of the third stage glass substrate 10. An electrode pad (not illustrated) formed on the lower surface of the semiconductor device 32 and an electrode pad (not illustrated) formed on the upper portion of the multilayer wiring structure 20a of the third stage glass substrate 10 are electrically connected to each other via a solder bump 34. In addition, the second stage glass substrate 10 having the semiconductor device 28 mounted thereon is mounted on the first stage glass substrate 10 having the semiconductor device 24 mounted thereon. An electrode pad (not illustrated) formed on the lower surface of the multilayer wiring structure 20b of the second stage glass substrate 10 and the electrode pad (not illustrated) formed on the upper portion of the multilayer wiring structure 20a of the first stage glass substrate 10 are electrically connected to each other via the solder bump 22. In addition, the third stage glass substrate 10 having the semiconductor device 32 mounted thereon is mounted on the second stage glass substrate 10 having the semiconductor device 28 mounted thereon. In addition, an electrode pad (not illustrated) formed on the lower surface of the multilayer wiring structure 20b of the third stage glass substrate 10 and the electrode pad (not illustrated) formed on the upper portion of the multilayer wiring structure 20a of the second stage glass substrate 10 are electrically connected to each other via the solder bump 22. The solder bump 22 is formed on the lower surface of the multilayer wiring structure 20a of the first glass substrate 10.

As illustrated in FIG. 9, then, the multiple stacked glass substrates 10 are collectively cut in the scheduled cutting line 11. As described above, the compressive stress layer 16 which ranges from one main surface to the other main surface of the glass substrate 10 is formed between the scheduled cutting line 11 and the functional region 13. Therefore, the glass substrate 10 is strengthened in the site. Accordingly, when the glass substrate 10 is cut in the scheduled cutting line 11, even if cracks occur on the glass substrate 10, it is possible to prevent the cracks from reaching the functional region 13.

In this manner, the electronic device according to the modification example in which the multiple interposers 15 and the multiple semiconductor devices 24, 28, and 32 are stacked on one another is manufactured.

Second Embodiment

A glasswork component, a manufacturing method thereof, an electronic device, and a manufacturing method thereof according to a second embodiment disclosed here will be described with reference to the drawings. The same reference numerals are given to configuration elements which are the same as those in the glasswork component and the manufacturing method according to the first embodiment illustrated in FIGS. 1 to 10, and thus description thereof will be omitted or simplified.

FIGS. 11A to 14B are process cross-sectional views illustrating the manufacturing method of the glasswork component and the manufacturing method of the electronic device according to the embodiment disclosed here.

Figure 11A:
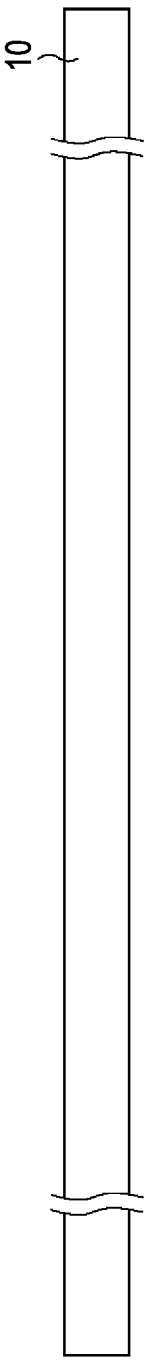
FIGS. 11A to 11C are process cross-sectional views (Part 1) illustrating a manufacturing method of a glasswork component according to a second embodiment disclosed here.

As illustrated in FIG. 11A, the substrate 10 is first prepared. For example, as the substrate 10, the glass substrate is used. The thickness of the glass substrate 10 is approximately 30 μm to 100 μm, for example.

Figure 11B:
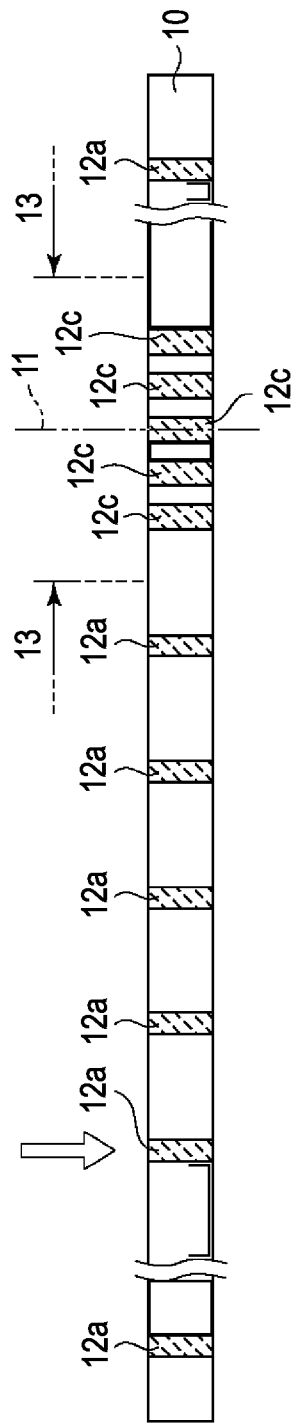

As illustrated in FIG. 11B, then, reformation portions 12a and 12c are formed by emitting laser beams to the glass substrate 10.

Similarly to the manufacturing method of the glasswork component according to the first embodiment, the reformation portion 12a serves to form the through-hole 14a. Therefore, the reformation portion 12a is formed in a scheduled site for forming the through-hole 14a (refer to FIG. 110). A shape of the reformation portion 12a is a columnar shape, for example. The reformation portion 12a is formed so as to range from one main surface to the other main surface of the glass substrate 10.

Figure 11C:
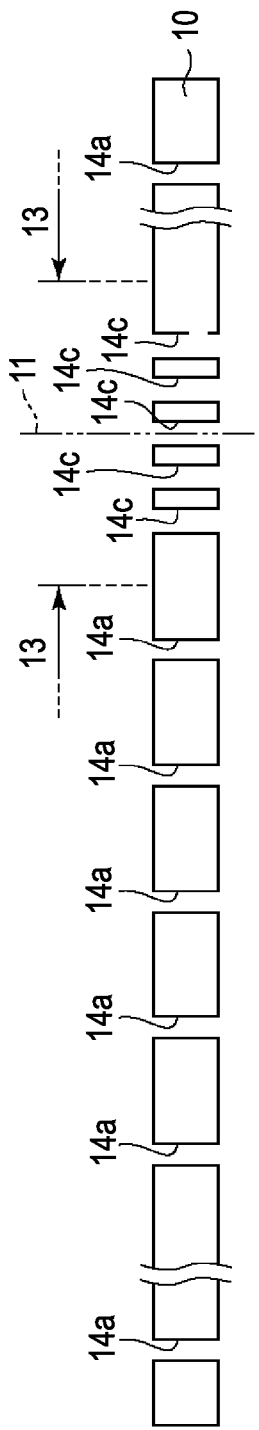

The reformation portion 12c serves to form a through-hole 14c (refer to FIG. 11C). The through-hole 14c is formed at multiple locations inside a region 38a (refer to FIGS. 15A and B) which is adjacent to the scheduled cutting line 11 and is extending along the scheduled cutting line 11. Therefore, the reformation portion 12c is formed at multiple locations inside the region which is adjacent to the scheduled cutting line 11 and is extending along the scheduled cutting line 11 (refer to FIG. 15A). A shape of the reformation portion 12c is a columnar shape, for example. The reformation portion 12c is formed so as to range from one main surface to the other main surface of the glass substrate 10.

As illustrated in FIG. 11C, then, the reformation portions 12a and 12c are etched and removed selectively. Since an etching rate of the reformation portions 12a and 12c is significantly faster than that of the glass substrate 10 within portions which are not reformed, it is possible to etch the reformation portions 12a and 12c selectively. If the reformation portion 12a is etched and removed, the through-hole 14a is formed in the site. As described in the first embodiment, the through-hole 14a serves to embed the via 18 therein in the subsequent process. The diameter of the through-hole 14a is in a range of several μm to several tens of μm, for example. In addition, if the reformation portion 12c is etched and removed, the through-hole 14c is formed in the site. The diameter of the through-hole 14c is in a range of several μm to several tens of μm, for example. Preferably, the dimension between the through-holes 14c in an in-plane direction of the glass substrate 10 is smaller than twice the thickness of the compressive stress layer 16 which is to be formed in the subsequent process. The reason for setting the dimension between the multiple through-holes 14c adjacent to each other in this way is that the compressive stress layer 16 continuous in the in-plane direction of the glass substrate 10 can be formed so as to be continuous along the scheduled cutting line 11.

Then, the compressive stress layer 16 is formed in the surface layer of the glass substrate 10 by using the ion-exchange method in the same manner as that in the manufacturing method of the glasswork component according to the first embodiment (refer to FIG. 12A). In this manner, the compressive stress layer 16 is formed in the surface layer of the glass substrate 10.

The dimension between the through-holes 14c in the in-plane direction of the glass substrate 10 is set to be smaller than twice the thickness of the compressive stress layer 16. Therefore, the ion-exchange is performed inside the overall region 38a (refer to FIGS. 15A and 15B) which is adjacent to the scheduled cutting line 11 and extends along the scheduled cutting line 11, and the compressive stress layer 16 which ranges from one main surface to the other main surface of the glass substrate 10 is formed into a band shape in the overall region 38a. Accordingly, the compressive stress layer 16 which is continuous in the in-plane direction of the glass substrate 10 is formed along the scheduled cutting line 11.

Figure 15A:
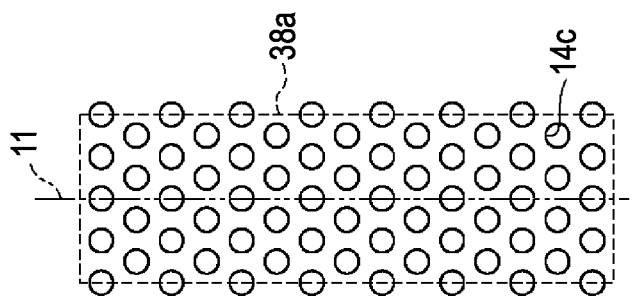
FIGS. 15A and 15B are a plan view and a cross-sectional view which illustrate stress distribution.
Figure 15B:
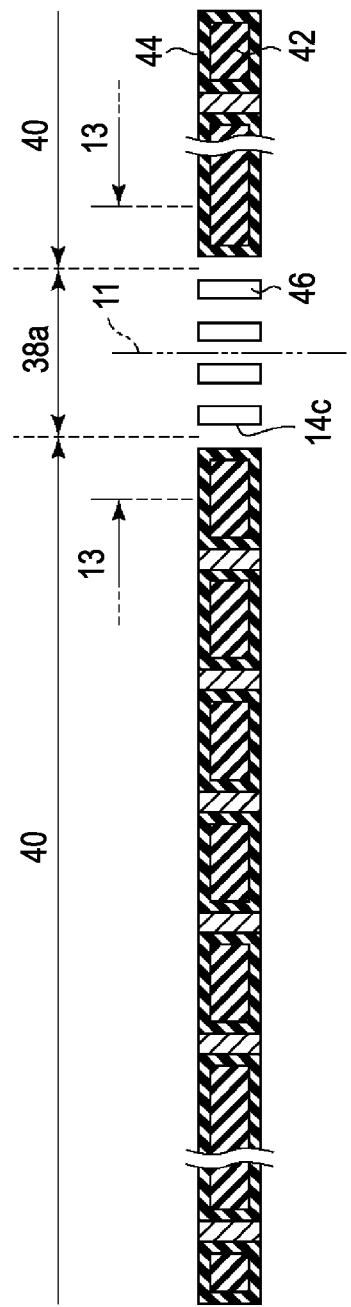

FIGS. 15A and 15B are a plan view and a cross-sectional view which illustrate stress distribution. FIGS. 15A and 15B illustrate the stress distribution corresponding to the structure illustrated in FIG. 12A. FIG. 15A is the plan view, and FIG. 15B is the cross-sectional view.

As illustrated in FIGS. 15A and 15B, the region indicated by the reference numeral 40 within the glass substrate 10 is configured so that the tensile stress region 42 is present inside the compressive stress region 44 serving as the compressive stress layer 16. Since the compressive stress region 44 and the tensile stress region 42 are present, the glass substrate 10 is strengthened in the region 40.

In contrast, the region indicated by the reference numeral 38a within the glass substrate 10 is a region where all are ion-exchanged. That is, the region 38a is not configured so that the tensile stress region 42 is present inside the compressive stress region 44. Therefore, the region 38a is the low residual stress region (less strengthened region) 46.

As illustrated in FIG. 12B, then, the via 18 is embedded into the through-hole 14a.

As illustrated in FIG. 12C, then, the multilayer wiring structures 20a and 20b are respectively formed on the upper surface side and the lower surface side of the glass substrate 10.

Figure 13A:
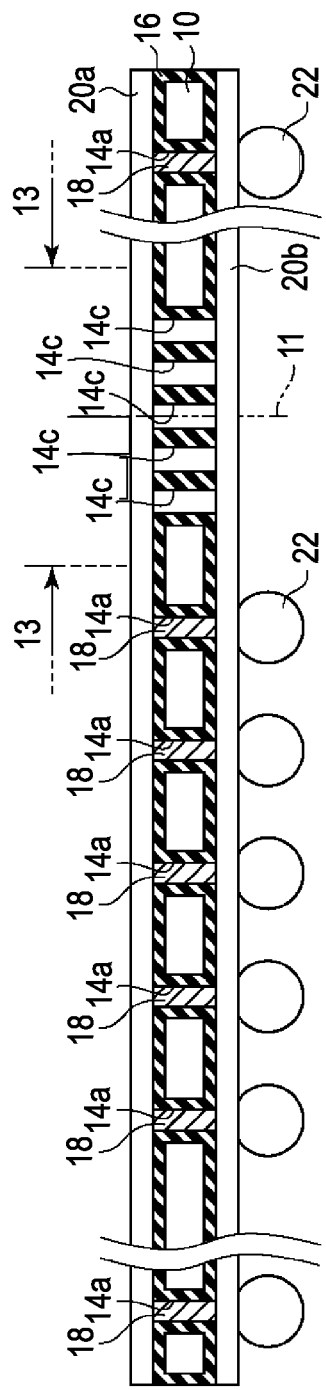
FIGS. 13A and 13B are process cross-sectional views (Part 3) illustrating the manufacturing method of the glasswork component according to the second embodiment disclosed here.

As illustrated in FIG. 13A, then, for example, the solder bump 22 is formed on the lower surface side of the multilayer wiring structure 20b.

Figure 13B:
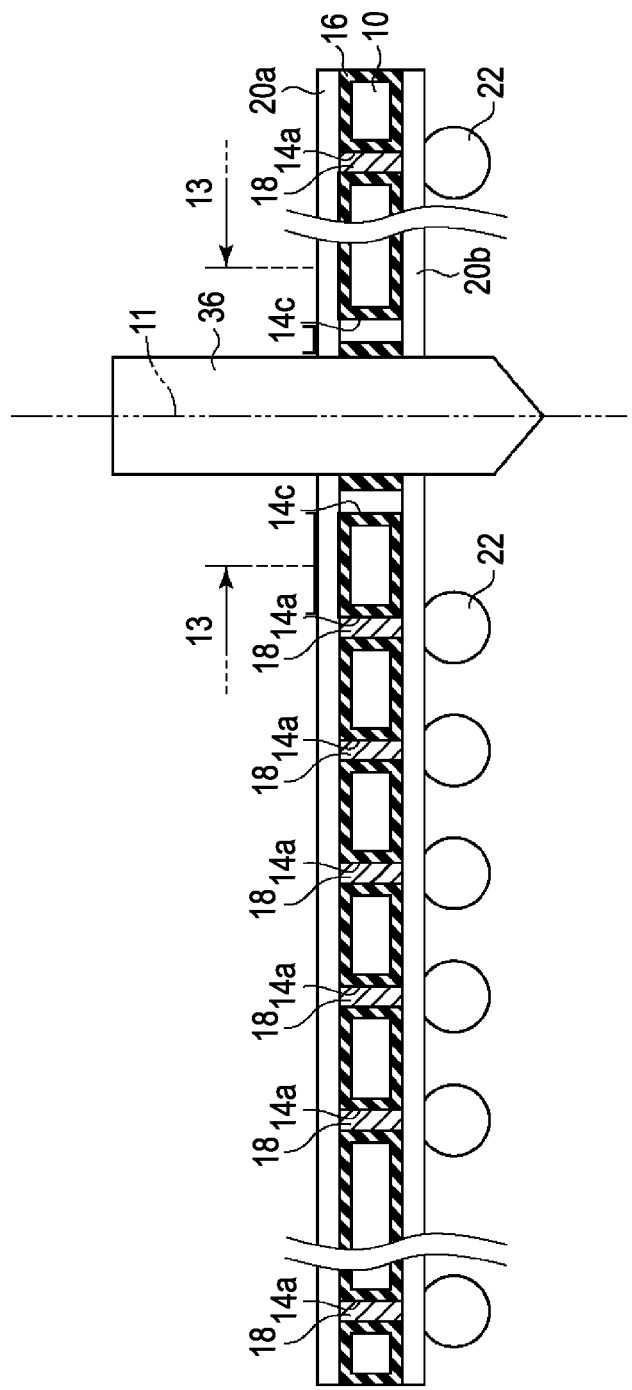

As illustrated in FIG. 13B, then, the glass substrate 10 is cut in the scheduled cutting line 11 by using the dicing blade 36. As described above, the compressive stress layer 16 which ranges from one main surface to the other main surface of the glass substrate 10 is formed into the band shape inside the region 38a which is adjacent to the scheduled cutting line 11 and extends along the scheduled cutting line 11. Therefore, the compressive stress layer 16 which ranges from one main surface to the other main surface of the glass substrate 10 is formed so as to extend along the scheduled cutting line 11 between the scheduled cutting line 11 and the functional region 13. The glass substrate 10 is strengthened in the site. Accordingly, when the glass substrate 10 is cut in the scheduled cutting line 11, even if cracks occur on the glass substrate 10, it is possible to prevent the cracks from reaching the functional region 13.

In this manner, the glasswork component according to the embodiment disclosed here, that is, the interposer 15 according to the embodiment disclosed here is manufactured (refer to FIG. 14A).

As illustrated in FIG. 14B, thereafter, the semiconductor device 24 is mounted on the interposer 15 according to the embodiment disclosed here.

In this manner, the electronic device according to the embodiment disclosed here is manufactured.

Modified Embodiment

Without being limited to the above-described embodiments, this disclosure can be modified in various ways.

For example, in the above-described embodiments, a case of cutting the glass substrate 10 used as the core layer of the interposer 15 has been described as an example, but the embodiments disclosed here are not limited thereto. For example, this disclosure can also be applied to a case of cutting the glass substrate used for a flexible-type thin display or a bendable-type thin display.

In the second embodiment, the height of the reformation portion 12c is adapted to be equal to the thickness of the glass substrate 10, but the height of the reformation portion 12c may be smaller than the thickness of the glass substrate 10. In this case, if the reformation portion 12c is etched and removed, a hole 14c which does not penetrate the glass substrate 10 is formed in the glass substrate 10. In this case, preferably, the thickness of the glass substrate 10 remaining below the hole 14c is smaller than twice the thickness of the compressive stress layer 16. If the thickness of the glass substrate 10 remaining below the hole 14c is smaller than twice the thickness of the compressive stress layer 16, when the compressive stress layer 16 is formed in the subsequent process, the glass substrate 10 of the portion below the hole 14c can reliably serve as the compressive stress layer 16.

This disclosure can be applied to various electronic devices (electronic equipment) such as personal computers, tablet terminals, smart phones, mobile phones, portable game machines, electronic books, television systems, displays (monitor devices), digital cameras, video cameras, audio reproducing devices (car audio devices and audio components), home game machines, and goggle-type displays (head-mounted displays). In addition, this disclosure can also be applied to cover glass of these electronic devices. In addition, this disclosure can also be applied to optical elements.

According to aspects of this disclosure, the compressive stress layer which ranges from one main surface to the other main surface of the glass substrate is formed along a scheduled cutting line, so as to be adjacent to the scheduled cutting line of the glass substrate. Therefore, according to an aspect of this disclosure, a strength-improved section is generated in a section which is adjacent to the scheduled cutting line and which extends along the scheduled cutting line. Therefore, according to an aspect of this disclosure, when the glass substrate is cut in the scheduled cutting line, even if cracks occur on the glass substrate in the scheduled cutting line, it is possible to prevent the cracks from reaching a functional region of the glasswork component. Accordingly, according to an aspect of this disclosure, even when the glass substrate is used, it is possible to obtain high production yield.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A manufacturing method of a glasswork component, comprising:
   forming first reformation portions by emitting laser beams to a glass substrate at both sides of a scheduled cutting line;
   forming groove-shaped recesses by removing the first reformation portions, each of the groove-shaped recesses having a thickness is that is thinner than a thickness of the glass substrate;
   forming a compressive stress layer which ranges from one main surface to the other main surface of the glass substrate, along the scheduled cutting line, so as to be adjacent to the scheduled cutting line of the glass substrate by immersing the glass substrate with the groove-shaped recesses in a chemical solution to perform an ion-exchange process; and cutting the glass substrate in the scheduled cutting line, whereby the compressive stress blocks cracks formed by cutting the glass substrate.

2. The manufacturing method of a glasswork component according to claim 1, wherein the first reformation portions have a thickness that is thinner than the thickness of the glass substrate, each of the first reformation portions being formed into a band shape by emitting the laser beams to the glass substrate in a region adjacent to the scheduled cutting line and extending along the scheduled cutting line; and the groove-shaped recesses are formed by etching and removing the first reformation portions, wherein while the compressive stress layer is formed, the compressive stress layer which ranges from one main surface to the other main surface of the glass substrate is formed in a portion including a side wall of the recess.

3. The manufacturing method of a glasswork component according to claim 1, further comprising:

forming additional multiple first reformation portions by emitting laser beams to multiple locations in a first region adjacent to the scheduled cutting line and extending along the scheduled cutting line before forming the compressive stress layer; and forming multiple holes by etching and removing the multiple first reformation portions, wherein while the compressive stress layer is formed, the compressive stress layer which ranges from one main surface to the other main surface of the glass substrate is formed in a portion including a side wall of the holes, and wherein an inter-hole portion of the multiple holes is filled with the compressive stress layer.

4. The manufacturing method of a glasswork component according to claim 1, further comprising:

forming a second reformation portion having a columnar shape which ranges from one main surface to the other main surface of the glass substrate, while the laser beams are emitted;

forming a through-hole penetrating the glass substrate by also removing the second reformation portion, while the first reformation portion is etched and removed; and embedding a via into the through-hole.

5. A glasswork component that is formed by the manufacturing method of claim 1.

6. A manufacturing method of an electronic device, comprising:

forming first reformation portions by emitting laser beams to a glass substrate at both sides of a scheduled cutting line;

forming groove-shaped recess by removing the first reformation portions, each of the groove-shaped recesses having a thickness is that is thinner than a thickness of the glass substrate;

forming a compressive stress layer which ranges from one main surface to the other main surface of the a glass substrate, along the a scheduled cutting line, so as to be adjacent to the scheduled cutting line of the glass substrate by immersing the glass substrate with the groove-shaped recesses in a chemical solution to perform an ion-exchange process;

cutting the glass substrate in the scheduled cutting line, whereby the compressive stress blocks cracks formed by cutting the glass substrate; and and mounting a semiconductor device on the glass substrate.

* * * * *